United States Patent [19]

Stamler

[11] 4,453,132

[45] Jun. 5, 1984

[54] ACTIVE FILTER

[75] Inventor: Michael M. Stamler, Chicago, Ill.

[73] Assignee: Motorola, Inc., Schaumburg, Ill.

[21] Appl. No.: 370,442

[22] Filed: Apr. 21, 1982

[51] Int. Cl.³ .............................................. H03F 1/36
[52] U.S. Cl. .................................... 330/107; 330/109; 330/100; 330/103
[58] Field of Search .................. 330/107, 109, 98, 99, 330/100, 103

[56] References Cited

U.S. PATENT DOCUMENTS

| | | | |
|---|---|---|---|
| 3,659,212 | 4/1972 | Saliga | 330/126 |
| 3,868,605 | 2/1975 | Poole | 330/107 |
| 4,078,215 | 3/1978 | Vinson | 330/108 |
| 4,158,818 | 6/1979 | Lerner | 328/167 |
| 4,246,542 | 1/1981 | Thanos | 330/107 |

FOREIGN PATENT DOCUMENTS 598216  3/1978  U.S.S.R. .............................. 330/107

Primary Examiner—James B. Mullins
Assistant Examiner—G. Wan
Attorney, Agent, or Firm—Joan Pennington; Edward M. Roney; James W. Gillman

[57] ABSTRACT

An active filter includes a first active stage including an operational amplifier and feedback means wherein the non-inverting input terminal of the operational amplifier is at a ground potential; a second active stage configured in the form of Miller integrator using an operational amplifier and connected in series with the first active stage; and means connecting the non-inverting terminal of the operational amplifier of the second active stage to the inverting terminal of the operational amplifier of the first active stage for enhancing the filter characteristics.

5 Claims, 6 Drawing Figures

ACTIVE FILTER

BACKGROUND OF THE INVENTION

This invention relates to an active filter and, more particularly, to an electronic active filter with improved filter characteristics.

An ideal filter would have a frequency response or transfer characteristic such that it should provide a high Q, that is, a sharp attenuation outside of a selected bandpass portion, and be stable, that is, free of thermal drift and noise interference.

Conventional active filters are, however, susceptible to thermal drift, phase delays and noise, as it is generally known. Various techniques have been devised to overcome these problems with some degree of success. Among the solutions that have been used are feedback techniques or some type of schemes designed to introduce phase lead that would cancel the phase lag associated with the parasitic elements of the filter. None, however, has been found fully satisfactory.

The object of the present invention is to provide an active filter which eliminates substantially parasitic effects of active elements of the filter.

It is another object of the present invention to provide an active filter which is not susceptible to thermal drift and which provides substantially enhanced filter characteristics.

It is yet another object of the present invention to provide an active filter which is simpler in structure compared to the conventional active filter.

SUMMARY OF THE INVENTION

The foregoing and other objects of the present invention are attained in a filter with two active stages. According to an embodiment of the present invention, a filter is provided with two active stages connected in series. The first stage includes an operational amplifier where the non-inverting input terminal of the operational amplifier is held at a ground potential. A second active stage configured in the form of well-known Miller integrator using an operational amplifier is connected in series with the first active stage. The non-inverting terminal of the operational amplifier of the second active stage is fed back to the inverting terminal of the operational amplifier of the first active stage. The filter of the foregoing design is found to eliminate substantially the parasitic phase lag and significantly enhance the Q of the filter.

According to a feature of the present invention, a substantially-improved notch filter is formed by using the inventive filter stated above. Thus, according to an aspect of the present invention, a notch filter is provided which includes a high bandpass filter stage coupled to the inverting input terminal of the first active stage of the filter described in the preceding paragraph with feedback means which feeds back the output of the first and the second acitive stages to the input of the high bandpass filter stages, a summing stage which sums the output of the high bandpass filter stage and the second active stage to provide a notched output.

DETAILED DESCRIPTION OF THE INVENTION

Figure 1:
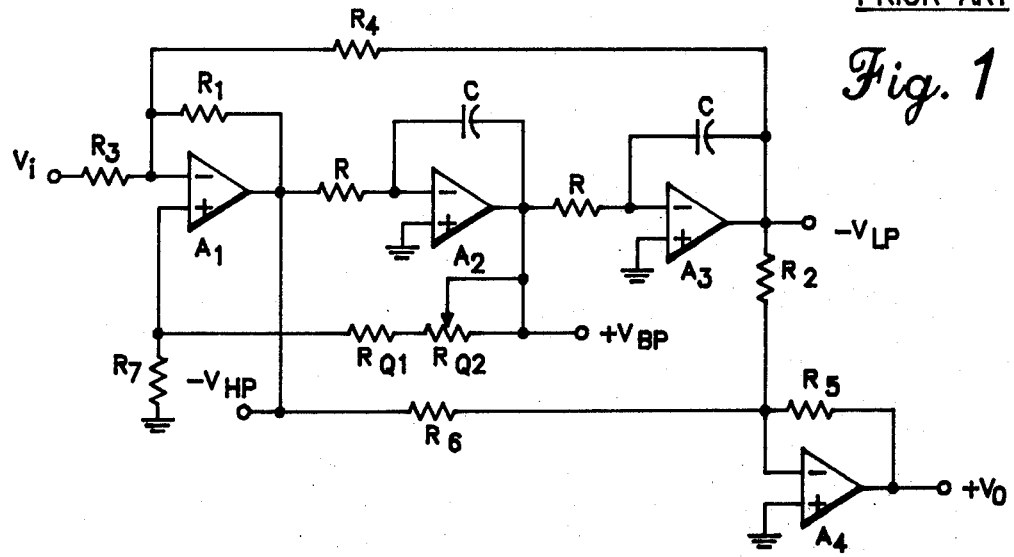
FIG. 1 illustrates a prior art state-variable active electronic filter using Miller integrator arranged in a second-order prototype stage.

A prior art complex filter, i.e., consisting of many poles and zeroes, is generally synthesized by cascading several second-order prototype sections (and a single first-order prototype if the degree of the filter is odd). FIG. 1 illustrates one such prior art second-order prototype section that uses well-known Miller integrator made of an input resistor R, an operational amplifier A2 and a feedback capacitor C. The state variable or H-K-N synthesis technique is commonly used to implement second-order prototypes.

For a detailed description of H-K-N synthesis technique, one may refer to "State-Variable Synthesis for Insensitive Integrated Circuit Transfer Functions," Kerwin W. J. Huelsman, L. P. and R. W. Newcomb, IEEE Journal of Solid-State Circuits, vol, sc-2, No. 3, September 1967. Such circuits are easily implemented using today's IC technology.

The prior art second-order prototype section of FIG. 1 comprises three dual input operational amplifier stages A1, A2, A3. The operational amplifier A1 has a feedback resistor R1, and the operational amplifiers A2, A3 have feedback capacitors C coupled to their respective inverting inputs of the amplifiers. Resistors R respectively connect the output of amplifier A1 to the first input of amplifier A2, and the output of amplifier A2 to the first input of amplifier A3. The second inputs of amplifiers A2 and A3 are grounded. The input signal is connected to terminal $V_i$ which is connected to the inverting input of amplifier A1 via a resistor $R_3$.

A feedback circuit comprised of resistors $R_{Q1}$ and $R_{Q2}$ is connected between the output of amplifier A2 and and an input of amplifier A1 for varying the "Q" of the circuit. A further feedback circuit between the output of amplifier A3 and the first input of amplifier A1 comprises a feedback resistor $R_4$.

The filter of FIG. 1 further comprises a dual input operational amplifier output stage A4 which acts as a summing stage. The stage includes, a first input of which is connected to the output of amplifier A3 via a resistor $R_2$, and to the output of amplifier A1 via a resistor $R_6$. A resistor $R_5$ feeds back the output of amplifier A4 to the first input thereof.

Second-order prototype stages of FIG. 1 may be cascaded by connecting any of the output terminal $V_o$ to the input terminal of the next succeeding filter stage. By adding additional second-order prototype sections or stages, additional poles and zeroes of the complex filter are added. If the degree of the filter is odd, a single first-order prototype stage may be added into the cascade.

The cascaded filter using stages as discussed above provides low-pass, high-pass, band-pass or notch filter operation depending upon where the output port is chosen. For example, if the output is taken at the terminal $V_{BP}$ illustrated in FIG. 1, the filter is a bandpass filter (second-order pole). If the output is taken at the terminal $V_{LP}$ of FIG. 1, the filter becomes a low-pass filter (second-order pole). If the output is taken at the terminal $V_{HP}$ of FIG. 1, the filter becomes a high-pass filter (second-order zero). If the output is taken at the output terminal of the summary amplifier A4, the filter becomes a notch filter.

Further, in the circuit of FIG. 1, the Q, gain and pole frequency of the second-order prototype are independently selectable. For example, the Q of the circuit is varied by varying the resistor $R_{Q2}$. The pole frequency of the second-order prototype, which may be independently selectable, is particularly important in the design of a variable filter. For such a variable filter, the cut-off frequency is varied by changing either the value of the resistors R or the value of the capacitors C. When such variations in the R's and/or C's are made, the filter maintains its Q and gain values. Thus, the same normalized transfer function should result, regardless of the cut-off frequency. As a result of maintaining the same normalized transfer function, the overall response of a cascade of second-order sections will also maintain its normalized transfer function.

As pointed out in the U.S. Pat. No. 4,246,542 granted to S. N. Thanos on Jan. 20, 1981, it is generally known that the parasitic capacitance of the operating amplifiers introduces a lagging phase shift at high frequencies, typically at 50 KHz affecting a change in the Q and gain of a second-order section from its ideal characteristic. This would preclude the use of such a known second-order prototype for implementing a variable filter operating at cut-off frequencies above 10 KHz. Thanos suggests use of an additional operational amplifier section, interposed between the output of the input operational amplifier A1 and the second operational amplifier A2, to introduce a leading phase shift at high frequencies. If all the operational amplifiers are matched, this will compensate for the lagging phase shift introduced by the parasitic capacitance of the amplifiers.

Thus, what Thanos suggests as a solution to the problem of phase delay in the active filter is to introduce an additional active operational amplifier and associated passive elements to introduce a phase lead to cancel the phase lag associated with parasitic elements of Miller integrators.

Figure 2:
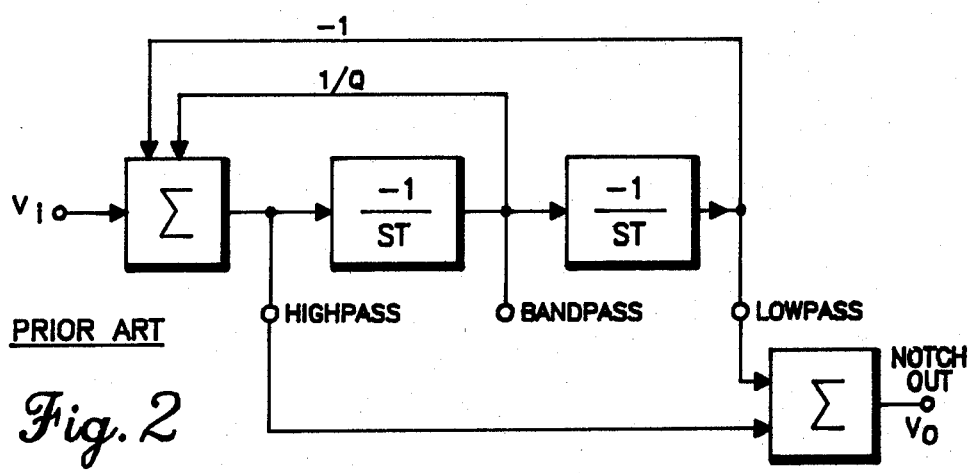
FIG. 2 shows a functional block diagram of the filter shown in FIG. 1.
Figure 5:
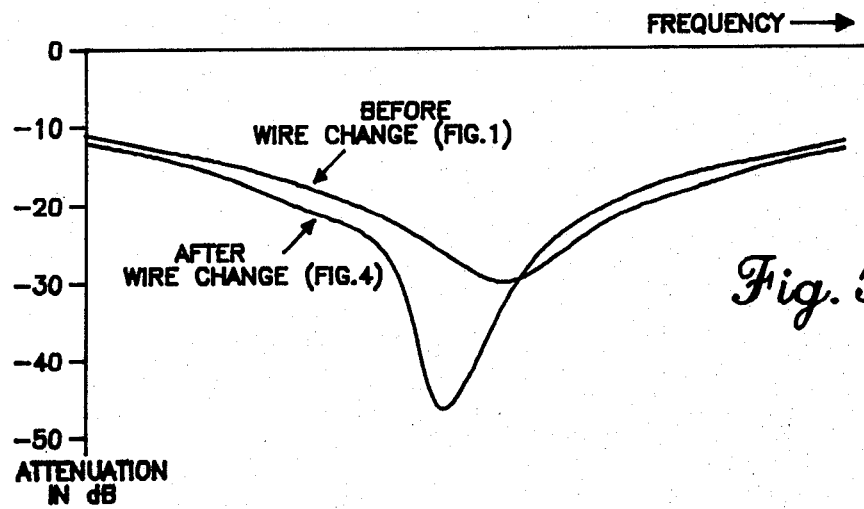
FIG. 5 illustrates amplitude vs. frequency response characteristics of the unmodified and modified state-variable filters shown in FIG. 1 and FIG. 4, respectively.

Referring to FIGS. 1 and 5, it was found that when the high and low-pass sections were summed by the summing amplifier A4 (which ideally yields a perfect notch transfer function), a notch depth of only 30 dB was observed. This limitation was attributed to the finite bandwidth of the operational amplifier which introduced parasitic phase lag and which unfortunately cannot be ignored here. Prior art literature has dealt with this problem, especially with regard to integrator applications, by quantifying the performance of an operational amplifier integrator through its effective Q factor which is defined as follows (prior art shown in FIG. 1 is shown in FIG. 2 in a functional schematic form for a well known conventional Laplace transform): Let H(s) define the transfer function of the integrator in question. In the ideal case this will be:

$$H(s) = 1/ST \text{ or } H(jw) = 1/jwT$$

All integrators, however, exhibit some loss which can be modelled by adding a resistor in parallel with the capacitor. Then H(s) becomes:

$$H(s) = \frac{1}{ST + K_1} \text{ or } H(jw) = \frac{1}{jwT + K_1} = \frac{1}{R + jI}$$

The Q factor is then defined as:

$$Q = \frac{I}{R},$$

where I stands for the imaginary of the denominator and R for the real part. Note that by this definition an ideal integrator will have an infinite Q factor.

With this in mind, a new analysis was performed on the above filter using the model shown in FIG. 2. It was then found that the notch depth at the center frequency was related to both the system Q and integrator Q as follows:

$$H(w_o) = 20 \log Q[1/Q_1 + 1/Q_2]$$

Note that in the ideal case, both $Q_{I1} = Q_{I2} =$ which yields an infinitely deep notch.

The integrators used in the filter are well-known Miller integrators, and their Q factors have been found to be equal to $Q = f_t/f$, where $f_t =$ unity gain bandwidth. Thus, for an operational amplifier rated at $f_t = 1$ MHz (such as the popular 741) operating at 2 KHz, the expected $Q_I$ is only 500. Using this value in equation (1) above for a system Q of 8 yields a notch depth of only $-30$ dB which correlates exactly with the measured value as shown in FIG. 5.

The question to be asked now is: What $Q_I$'s are required to yield deeper notches? Using equation (1), it can be shown that if $Q_{I1}$ is fixed at 500, then $Q_{I2}$ would have to be increased to 8000 to achieve a notch depth of $-35$ dB. This kind of Q factor has so far been unattainable without resorting to passive compensation techniques or by employing additional active and passive components which are highly undesirable. In any event, the conclusion to be made from the above observations is that the integrator Q's must somehow be increased significantly in a stable manner at minimum cost. This then excludes the possibility of using higher bandwidth operational amplifiers which are not cost effective and which increase $Q_I$ by only a factor of four at best.

Figure 3:
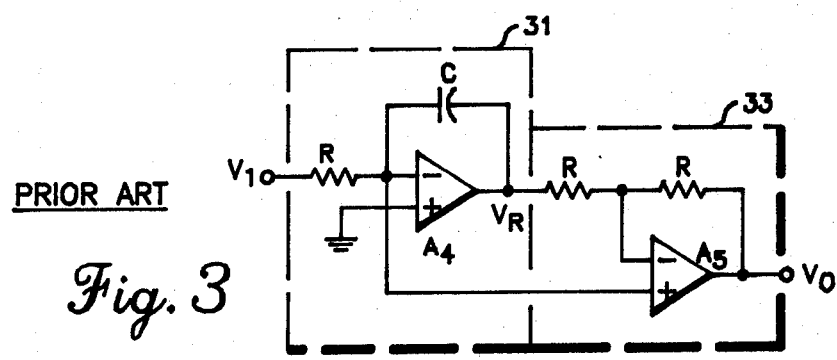
FIG. 3 illustrates a non-inverting integrator which is an inverting Miller integrator stage connected in series with an inverter.

There has been a number of ways suggested by the prior art to increase the Q of the integrator. One way is to recognize as shown in the aforementioned Thanos U.S. Pat. No. 4,246,542, that the finite operational amplifier bandwidth contributes an extra pole to the transfer function (i.e., introduces excess phase lag) so that introducing another zero by adding a resistor should cancel this parasitic pole and so increase the Q. Unfortunately, because this method is implemented passively, the Q will not be guaranteed for changing environmental conditions, such as varying temperature and humidity. Another way uses a technique whereby the integrator is compensated by using only the operational amplifier itself. As illustrated in FIG. 3, one application of this idea was used on a non-inverting integrator which consisted of a Miller integrator 31 in series with an inverter 33.

The last solution mentioned is a form of feed-forward compensation technique employed in the non-inverting integrator as shown of FIG. 3. This is a modified Miller-inverter integrator which is found to increase effective Q of the integrator from $f_t/3f$ to $f_t/f$ where $f_t$ is unity gain bandwidth and f is the operating frequency and thereby achieves a threefold increase in the Q-factor magnitude by changing only one connection. For further details of this solution, one may refer to "Active Compensation for High Frequency Effects in Op amp Circuits," IEEE Trans. Circuits & Systems, VOL CAS-23, pg. 68-73) by P. O. Brackett and A. S. Sedra (see FIG. 1 and 2, and especially FIG. 1, f and associated texts).

While the last-mentioned solution does increase the Q, it does not, however, deal with nor is it found to be capable of correcting phase lag introduced by the parasitic effects of the operational amplifiers in the Miller integrator itself.

Figure 4:
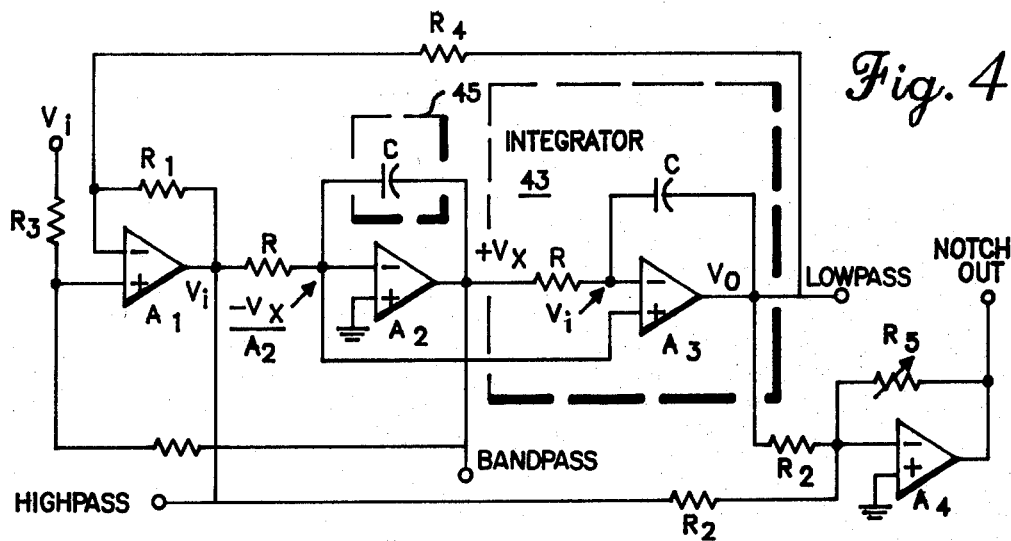
FIG. 4 is an illustrative embodiment of a modified state-variable active filter according to the present invention.

In accordance with the present invention, a new modified state-variable filter is designed which actively compensates the second integrator 43, as shown in FIG. 4, by merely changing one of the wires. This wire change has been shown to increase the effective Q of the integrator from $(f_t/f)$ to $(f_t/f)^2$. Thus, instead of working with integrator Q's on the order of 500, which, as has been shown, greatly limits notch depth, it is now possible to attain Q factors on the order of 250,000.

The effective Q from $(f_t/f)$ to $(f_t/f)^2$ can be shown with reference to FIG. 4 by the following analysis. Thus, referring to FIG. 4, for general analysis the filter of the present invention includes the operational amplifier A2 in series with a Miller integrator 43 made of the operational amplifier A3. The feedback of the amplifier A2 is shown as a capacitor C. But it could be any combination of passive elements, generally designated as 45.

Now the analysis:

Ideally $v_o/v_x = -1/SCR$

However, the actual transfer function, $V_o/V_x$, will be the product of the ideal term and a parasitic term, i.e.:

$$\frac{v_o}{v_i} = \frac{-1}{SCR} \cdot [P(S)] \quad P(S) - \text{Parasitic term}$$

definition: any non ideal integrator can be written in the form:

$$H(jw) = \frac{A(jw)}{B(w) + jc(w)}$$

then, the "Q" of the integrator is defined as:

$$Q \triangleq \frac{\text{Imaginary}}{\text{Real}} = \frac{C(w)}{B(w)}$$

Ideally $B(w)=0 \therefore Q=\infty$. Hence, the larger the Q the better the integrator.

It will be shown that the Q of the above integrator will be: $Q \approx |A|^2$ where $|A|$ = open loop gain of operational amplifiers.

Note: The Q of the integrator without the above compensation is $Q=|A|$.

The node equation at the inverting (−) terminal of stage A3 is:

$$\frac{v_1 - v_x}{R} + (v_1 - v_o)SC = 0$$

$$v_1(1+SCR) = V_oSCR + v_x$$

The open loop gain equation for stage 3 is:

$$v_o = (v^+ - v^-)A_3$$

$$= \left(\frac{-v_x}{A_2} - v_1\right)A_3$$

$$-v_1 = \frac{v_o}{A_3} + \frac{v_2}{A_2}$$

combining (2) into (1) yields:

$$\frac{v_o}{v_x} = \frac{-1}{SCR}\left[\frac{(1+SCR)/A_2 + 1}{(1+1/SCR)/A_3 + 1}\right] \quad (3)$$

Note that equation 3 is the equation of the integrator with finite operational amplifier gains taken into consideration. The ideal term ($-1/SCR$) is multiplied by the parasitic term. For ideal operational amplifiers, i.e., $A_2=A_3=\infty$, the parasitic term disappears yielding only the ideal term.

The gain of an operational amplifier, A, is actually a function of s:

$A = W_t/s$ where $w_t$ = unity gain bandwidth
$(\approx 2\pi \times 10^6)$ then, $A2 = w_{t2}/s$ $A3 = w_{t3}/s$ substituting into equation 3 and multiplying through yields:

$$\frac{v_o}{v_x} = \frac{-1}{SCR}\left[\frac{S^2RC/w_{t2} + S/w_{t2} + 1}{S/w_{t3} + \frac{1/RC}{w_{t2}} + 1}\right] \quad (4)$$

Now the cut-off frequency of the integrator is $wo=1/RC$ and $$w_o < w_t \therefore \frac{1/RC}{w_{t2}} << 1 \quad (5)$$

$$\frac{v_o}{v_x} \approx \frac{-1}{SCR}\left[\frac{S^2RC/w_{t2} + s/w_{t2} + 1}{s/w_{t3} + 1}\right] \text{ for } w_o << w_t$$

$$\therefore \frac{v_o}{v_x}(s) = -\frac{S^2RC/w_{t2} + s/w_{t2} + 1}{S^2RC/w_{t3} + SCR}$$

substituting $s=jw$ into 4 and eliminating complex terms in the numerator yields:

$$\frac{v_o}{v_x} = \frac{\left(1 - \frac{w^2RC}{w_{t2}}\right)^2 + \left(\frac{w}{w_{t2}}\right)^2}{\left(w^2RC\left[\frac{1}{w_{t3}} - \frac{1}{w_{t2}}\right] - \frac{w^4R^2C^2}{w_{t2}w_{t3}}\right) - > \left(\frac{w^3RC}{w_{t3}w_{t2}} - \frac{w^3R^2C^2}{w_{t2}} = wRC\right)}$$

for operational amplifiers that are similar (in the same package), $w_{t2} \approx w_{t3} = w_t$ $$\frac{v_o}{v_x} = -\frac{\left(1 - \frac{w^2RC}{w_t}\right)^2 + \left(\frac{w}{w_t}\right)^2}{\frac{w^4R^2C^2}{w_t^2} + jwRC\left(1 - \frac{w^2RC}{w_t} + \frac{w^2}{w_t^2}\right)}$$

now $1 = \frac{w^2RC}{w_t} + \frac{w^2}{w_t^2} = 1 - \frac{w^2}{w_ow_t} + \frac{w^2}{w_t^2}$ sine $w_o = \frac{1}{RC} \approx 1$ for $w << w_t$ using this approximation yields:

$$\frac{v_o}{v_x} = -\frac{1}{\left(\frac{w^4R^2C^2}{w_t^2} + jwRC\right)} \quad (6)$$

equation V is in the form of:

$$H(w) = \frac{A}{B(w) + jc(w)}$$

following the definition of an integrator as specified above, the Q of the compensated integrator is:

$$Q = \frac{c(w)}{B(w)} = \frac{wRC}{w^4R^2C^2/w_t^2} = \frac{w_t^2}{RCw^3}$$

Now, the frequency that this integrator will be operating at is $w = 1/RC$ nd the performance of this integrator will be most critical at this frequency. Thus, $$Q = \frac{w_t^2}{w^2} \quad (7)$$

note that the gain of an operational amplifier was defined as:

$$A(S) = \frac{w_t}{s}$$

$$A(jw) = \frac{w_t}{jw}$$

$$|A| = \frac{w_t}{w}$$

substituting in (6) yields: $Q = |A|^2$

In conclusion, the above analysis has shown that the Q of the Miller integrator compensated as shown in FIG. 4 increases the Q from $|A|$, as reported in the literature, to $|A|^2$. It has also been shown in the literature that for $Q = |A|$, the performance of the state variable filter that uses this integrator is limited primarily to the finite Q of the integrator.

The increase of the integrator Q has been achieved, as reported in the literature, from $|A|$ to $|A|^3$, but this increase has always cost at least one additional active stage.

It should be noted that nowhere in the literature was there a method shown that increased the integrator Q beyond the value of $(f_t/f)$ without adding an additional operational amplifier. This is a keypoint of this invention, i.e., that a squaring of the effective integrator Q was attainable by merely changing a wire and whereas, according to the prior art, to do the same, another operational amplifier has to be used. As stated before, while it is also possible to cube the Q by adding an operational amplifier in the feedback path, such an approach is unsuitable, if one's object is to minimize component cost or to limit the filter to a single quad package, as is the case here.

In most applications, a Q factor of $(f_t/f)^2$ will more than suffice, especially in the notch filter as illustrated in FIG. 4. If a high Q is applied to both integrators, then the notch depth will approach the noise floor of the system approach much more than was possible with the prior art filters. In addition, such a filter would remain stable over temperature and humidity. It is this kind of specification that can be met by using the compensation technique described herein.

There are other important applications where a high Q integrator would be required, one being the state-variable bandpass filter. Unlike in notch filters where it can be intuitively seen that the high attenuation levels demanded is inherently dependent and limited to the open-loop gain, and thus its Q, the equivalent bandpass output in a not-so-intuitive way can also be adversely affected by finite integrator Q's. It has been shown by Lee Thomas that the system Q of the filter which determines its bandwidth has a tendency to increase when excess phase lag that results from finite integrator Q's is present in the loop, according to the following equation:

$$Q_{eff} = \frac{1}{1/Q - \frac{4f_o}{f_t}}$$

where
$Q$ = System $Q$
$Q_{eff}$ = effective System $Q$

Clearly, the effective Q, $Q_{eff}$, obtained will be enhanced by the $(4f_o/f_t)$ term in the denominator and, in some cases, can make the entire filter useless. For further details, refer to "The Biquad—Some Practical Design Considerations," IEEE Trans. circuit Theory, Vol. CT-18 pg. 350-357, May 1971, by Thomas, Lee). As an example, for a system Q of 30 operating at 5 KHz with operational amplifier rated with $f_t = 1$ MHz, which is not an unusual specification, the effective Q obtained is actually 75. This is an increase in excess of 100% and is clearly unacceptable.

This effect has been observed and measured in filters used in existing products at Motorola, Inc., and so the need for effective compensation techniques becomes even more evident. Note that the technique described here is easily implemented on these existing products since only a wire change is required. Thus, it becomes extremely easy to increase the product performance at decreased MOL time and subsequently, decreased cost.

Finally, because of this enhancement, people have been reluctant to use this filter with Q's higher than 25 even though it was originally intended to be used at Q's of well over 100. The compensation technique thus frees from this limitation by stabilizing the system Q.

It is important to realize the differences between the scheme described here and the scheme described in the above-named paper by P. O. Brackett et al. The above study considered the effects of adding an inverting amplifier to an existing Miller integrator. It was shown that this addition degraded the integrator Q from $F_t/f$ to $f_t/3f$, which was highly undesirable. This problem was then solved by actively compensating the inverter stage to cancel its ill effects on the performance of the non-inverting integrator circuit shown in FIG. 3. Thus, whe the overall Q of the integrator was calculated, the degrading effects of the inverter were no longer present, and so the value of $Q_I$ remained unchanged at $f_t/f$. Note that no improvement over the original Q factor was realized.

The scheme described here sharply differs from the above approach in that the focus of attention is on increasing the existing Q factor of the integrator rather than trying to compensate for its degradation due to the addition of another operational amplifier stage. In other words, it was attempted to make the integrator used in the notch filter as perfect as possible, i.e., make its Q infinitely large, while the intent of the previous scheme was to return the integrator Q from its degraded value of $f_t/3f$ to its original value of $f_t/f$ which was still not an acceptable value.

The scheme used here did in fact increase the integrator Q to well beyond its previous value of $f_t/f$. It was shown, an analytically proven above, that the Q factor obtained reached $(f_t/f)^2$, which effectively made the integrator practically perfect. Thus, with this improved performance, the limitations in notch depth that came about from having a low Q integrator no longer exist. What is then realized in the final circuit is an improvement that mkes the integrator almost ideal rather than just slightly better.

The above innovation has increased the integrator Q by having the operational amplifiers compensate themselves. This is dramatically illustrated in FIG. 5 which shows actually-measured attenuation vs. frequency characteristics of a notch filter before and after the wire change. Thus, not only is performance greatly improved, it is also guaranteed over varying temperature and humidity and overtime. This is crucial when considering performance of the product in high humidity environments in which previous designs have failed to perform. The improvement exists because as the parasitic pole in the operational amplifier moves, the above feedforward arrangement will adjust itself to compensate for the change.

The design is also easy to implement in products that already use active filters since minimal layout change is required. Furthermore, the principle described in the present invention can be easily applied to active filters of other designs in a similar fashion, as illustrated in the Thomas biquad modified state-variable filter in FIG. 6.

Figure 6:
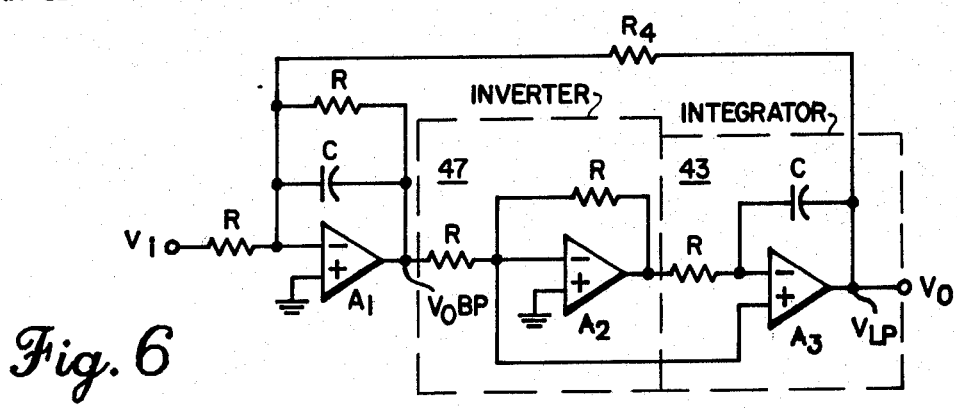
FIG. 6 illustrates an illustrative embodiment of a Thomas-Biquad modified state-variable filter according to the present invention.

FIG. 6 represents a modification of the state variable filter shown in FIG. 4. Here by adding an inverter stage 47 the need for feeding back the bandpass output VoBP to the non-inverting terminal of the first stage is eliminated since raw feedback to the inverting terminal is possible. This yields a filter whereby all the non-inverting terminals are at ground potential which is a very desirable characteristic.

It has been shown that problems that arise from using finite Q integrators, especially in filter circuits, can be virtually eliminated by compensating the integrator in a new and unique way. The result is that the magnitude of the integrator Q can effectively be squared by changing only a single wire. Although active compensation of the type described herein has been used before, it has only resulted in a minimal increase in performance as has been revealed in this invention. The technique described here clearly renders the integrators virtually ideal in an unprecedented manner and so has tremendous potential in both existing and future product lines that require top performance filters.

I claim:
1. An active filter comprising:
    a first active stage including an operational amplifier having an inverting input terminal and a non-inverting input terminal at ground potential and feedback means;
    a second active stage including an operational amplifier having an inverting input terminal and a non-inverting input terminal configured in the form of a Miller integrator having an effective Q factor, and said inverting input terminal of said second active stage coupled to the output of said first active stage; and
    said non-inverting terminal of the operational amplifier of the second active stage connected to said inverting input terminal of said operational amplifier of said first active stage whereby said effective Q factor of said Miller integration is increased for enhancing the filter characteristics.
2. The filter according to claim 1 wherein said first active stage is configured in the form of a Miller integrator.
3. The filter according to claim 2, including:
    an input stage coupled to said inverting input of said first active stage;
    feedback means for coupling the output of both said first and said second active stages to an input of said input stage; and
    a summing stage for summing the output of said input stage and said second active stage and for providing a notched output whereby the filter acts as a notch filter.
4. The filter according to claim 1, including a lossy integrator having the output thereof coupled to said inverting input of said first active stage and feedback means for coupling the output of said second active stage to an inverting input of said lossy integrator.
5. An improved second-order, state-variable filter comprising:
    an input means;
    a first active stage coupled to receive input from said input means, including an operational amplifier and first feedback means therefor configured in the form of a lossy integrator;
    a second active stage coupled to the output of said first active stage, said second active stage including an operational amplifier and a resistive feedback means therefor;

a third active stage coupled to the output of said second active stage, said third active stage including an operational amplifier and capacitive feedback means therefor;

second feedback means for coupling the output of said third active stage to the inverting input of said first active stage;

the non-inverting input terminal of said operational amplifier of said third active stage connected to the inverting input terminal of said operational amplifier of said second stage; and said first active stage summing the input from said input means and feedback signals from said first and second feedback means.

* * * * *